(12) United States Patent
Kim

(10) Patent No.: US 8,884,645 B1
(45) Date of Patent: Nov. 11, 2014

(54) SEMICONDUCTOR APPARATUS

(71) Applicant: SK Hynix Inc., Icheon-si (KR)

(72) Inventor: Jong Sam Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/018,982

(22) Filed: Sep. 5, 2013

(30) Foreign Application Priority Data

May 22, 2013 (KR) .................. 10-2013-0057556

(51) Int. Cl.
*H03K 17/16* (2006.01)
*H03K 19/00* (2006.01)
(52) U.S. Cl.
CPC .................. *H03K 19/0016* (2013.01)
USPC ............... 326/33; 326/31; 327/535; 327/538; 323/312
(58) Field of Classification Search
USPC ............... 326/31, 33; 327/535, 538; 710/302, 710/304; 323/312
See application file for complete search history.

(56) References Cited

U.S. PATENT DOCUMENTS

| 7,358,792 B2 * | 4/2008 | Taki et al. ...................... 327/530 |
| 2009/0097333 A1 * | 4/2009 | Gou ........................... 365/189.09 |
| 2012/0287735 A1 * | 11/2012 | Song .............................. 365/191 |
| 2013/0155787 A1 * | 6/2013 | Dawson et al. .......... 365/189.09 |

FOREIGN PATENT DOCUMENTS

| KR | 1020000030505 A | 6/2000 |
| KR | 1020100064904 A | 6/2010 |

* cited by examiner

*Primary Examiner* — Jason M Crawford
(74) *Attorney, Agent, or Firm* — William Park & Associates Patent Ltd.

(57) ABSTRACT

An internal voltage generation circuit of a semiconductor apparatus includes: an active driver configured to output an internal voltage to an output node; a standby driver configured to output the internal voltage to the output node; and a voltage stabilizer connected to the output node. The voltage stabilizer starts a voltage stabilization operation of supplying or receiving electric charges to or from the output node when an active enable signal is disabled, and stops the voltage stabilization operation in a predetermined time after to the active enable signal is enabled.

20 Claims, 2 Drawing Sheets

SEMICONDUCTOR APPARATUS

CROSS-REFERENCES TO RELATED APPLICATION

The present application claims priority under 35 U.S.C. §119(a) to Korean application number 10-2013-0057556, filed on May 22, 2013, in the Korean Intellectual Property Office, which is incorporated herein by reference in its entirety.

BACKGROUND

1. Technical Field

Various embodiments relate to a semiconductor apparatus, and more particularly, to a circuit for stabilizing an internal voltage.

2. Related Art

A semiconductor apparatus converts a voltage supplied from outside into an internal voltage Vint according to a level required inside the semiconductor apparatus, and supplies the internal voltage Vint to an internal circuit. Depending on requirements of the respective regions of the semiconductor apparatus, a core voltage Vcore, a bulk bias Vbb, a pumping voltage Vpp and the like are used. In order to generate the internal voltages using the voltage supplied form outside, corresponding internal voltage generation circuits exist.

FIG. 1 is a block diagram of a conventional semiconductor apparatus using an internal voltage generation circuit 10.

The semiconductor apparatus includes the internal voltage generation circuit 10 and an internal circuit 20 configured to receive the internal voltage Vint and perform a predetermined operation.

The internal voltage generation circuit 10 includes a driver 15 configured to generate the internal voltage Vint from an external voltage and a capacitor C1 configured to stabilize the internal voltage Vint.

When the internal circuit 20 enters an active mode such that current consumption rapidly increases, the capacitor C1 supplies an electric charge stored therein so as to stabilize the voltage level. Then, the capacitor C1 receives electric charges corresponding to the supplied electric charges through the internal voltage Vint outputted from the driver 15 and stores the received electric charges. That is, the capacitor C1 performs the voltage stabilization operation by repeating the operation of supplying and receiving electric charges.

At this time, when the capacitor C1 is connected to an output node node_out at all time, the internal voltage Vint outputted from the driver 15 charges the capacitor C1 which is not filled with electric charges, and is then supplied to the internal circuit 20. Since the voltage stabilization ability of the capacitor C1 is proportional to the capacity of the capacitor C1, the circuit may be configured with a capacitor having a large capacity. Thus, when the capacitor C1 has a large capacity, the process of charging the capacitor C1 may degrade the performance of the circuit.

SUMMARY

Various embodiments are directed to an internal voltage generation circuit of a semiconductor apparatus, which is capable of improving the performance of a circuit by limiting a time during which a capacitor performs a voltage stabilization operation of supplying or receiving electric charges.

In an embodiment of the present invention, an internal voltage generation circuit of a semiconductor apparatus includes: an active driver configured to output an internal voltage to an output node; a standby driver configured to output the internal voltage to the output node; and a voltage stabilizer connected to the output node. The voltage stabilizer starts a voltage stabilization operation of supplying or receiving electric charges to or from the output node when an active enable signal is disabled, and stops the voltage stabilization operation in a predetermined time after the active enable signal is enabled.

In an embodiment of the present invention, an internal voltage generation circuit of a semiconductor apparatus includes: an active driver configured to output an internal voltage to an output node in response to an active enable signal; a standby driver configured to output the internal voltage to the output node; and a charge/discharge unit disconnected from the output node in a predetermined time after the active enable signal is enabled, and connected to the output node when the active enable signal is disabled.

In an embodiment of the present invention, an internal voltage generation circuit includes: an active driver configured to generate and supply an internal voltage to an output node during an active operation; a standby driver configured to generate and supply the internal voltage to the output node regardless of an operation mode; and a voltage stabilizer connected to the output node and configured to perform a voltage stabilization operation and maintain a voltage level of the internal voltage.

BRIEF DESCRIPTION OF THE DRAWINGS

Features, aspects, and embodiments are described in conjunction with the attached drawings, in which.

DETAILED DESCRIPTION

Hereinafter, an internal voltage generation circuit of a semiconductor apparatus according to the present invention will be described below with reference to the accompanying drawings through various embodiments.

Figure 1:
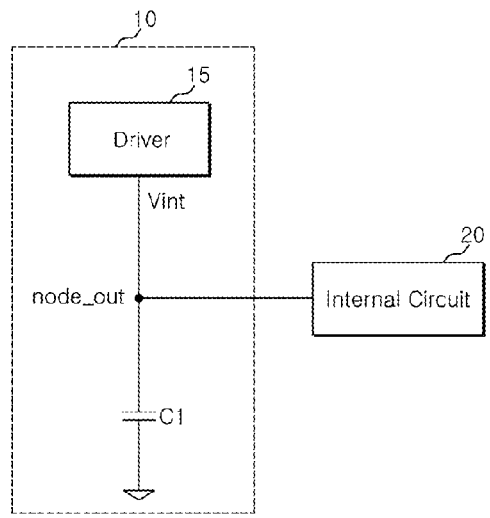
FIG. 1 is a block diagram of a conventional semiconductor apparatus using an internal voltage generation circuit.
Figure 2:
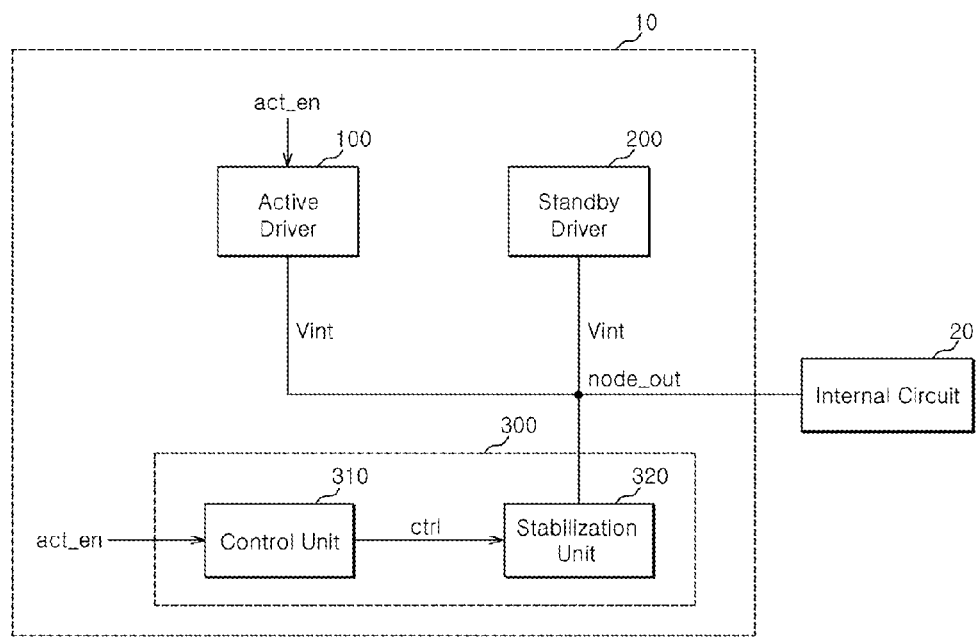
FIG. 2 is a block diagram of a semiconductor apparatus using an internal voltage generation circuit according to an embodiment of the present invention.

FIG. 2 is a block diagram of a semiconductor apparatus using an internal voltage generation circuit 10 according to an embodiment of the present invention.

The semiconductor apparatus according to an embodiment of the present invention may include an internal voltage generation circuit 10 and an internal circuit 20 configured to receive an internal voltage Vint and perform a predetermined operation.

The internal voltage generation circuit 10 according to an embodiment of the present invention may include an active driver 100, a standby driver 200, and a voltage stabilizer 300. The active driver 100 may be configured to output the internal voltage Vint to an output node node_out in response to an active enable signal act_en. The standby driver 200 may be configured to output the internal voltage Vint to the output node node_out regardless of an operation mode. The voltage stabilizer 300 may be connected to the output node node_out.

The voltage stabilizer 300 may start a voltage stabilization operation of supplying or receiving electric charges to or from the output node node_out when the active enable signal act_en is disabled, and stop the voltage stabilization operation in a predetermined time after the active enable signal act_en is enabled.

The active driver 100 may generate the internal voltage Vint and supply the generated voltage to the internal circuit 20 in response to the active enable signal act_en. That is, the active driver 100 may output the internal voltage Vint when the active enable signal act_en is enabled during an active operation. The active driver 100 may include a CMOS driver or analog driver, and the type of the active driver 100 is not limited thereto.

The standby driver 200 may generate the internal voltage Vint and supply the generated voltage to the internal circuit 20, regardless of the operation mode of the semiconductor apparatus. Thus, the standby driver 200 may maintain the voltage level of the internal circuit 20 to a target voltage level. For example, when the internal circuit 20 enters the active mode, the standby driver 200 may control the internal circuit 20 to rapidly operate.

The voltage stabilizer 300 may be connected to the output node node_out so as to perform the voltage stabilization operation, and constantly maintain the voltage level of the internal voltage Vint supplied to the internal circuit 20.

The voltage stabilizer 300 may include a control unit 310 and a stabilization unit 320. The control unit 310 may be configured to output a control signal ctrl to control the start and stop of the voltage stabilization operation, in response to the active enable signal act_en. The stabilization unit 320 may be configured to perform the voltage stabilization operation in response to the control signal ctrl.

Figure 3:
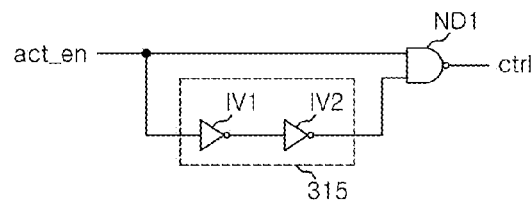
FIG. 3 is a circuit diagram of a control unit of FIG. 2.

FIG. 3 is a circuit diagram of the control unit 310 of FIG. 2.

The control unit 310 may include a delay section 315 and a NAND gate ND1. The delay section 315 may be configured to receive the active enable signal act_en and delay the received signal. The NAND gate ND1 may be configured to receive an output of the delay section 315 and the active enable signal act_en and output the control signal ctrl.

The delay section 315 may include an even number of inverters connected in series. FIG. 3 illustrates two inverters IV1 and IV2. The first inverter IV1 may receive the active enable signal act_en, and the second inverter IV2 may receive the output of the first inverter IV1.

The NAND gate ND1 may receive the output of the second inverter IV2 and the active enable signal act_en and perform a NAND operation on the received signals. The NAND gate ND1 may output the control signal ctrl as the operation result to the stabilization unit 320.

Figure 4:
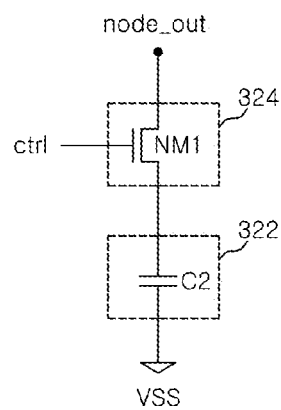
FIG. 4 is a circuit diagram of a stabilization unit of FIG. 2.

FIG. 4 is a circuit diagram of the stabilization unit 320 of FIG. 2.

The stabilization unit 320 may include a charge/discharge section 322 and a switching section 324. The charge/discharge section 322 may be configured to supply or receive electric charges. The switching section 324 may be configured to connect or disconnect the charge/discharge section 322 to or from the output node node_out.

The charge/discharge unit 322 may include a capacitor C2. The capacitor C2 has one end connected to one end of the switching section 324 and the other end connected to a ground terminal VSS.

The switching section 324 may include an NMOS transistor NM1. The NMOS transistor NM1 has a gate configured to receive the control signal ctrl, one end connected to the output node node_out, and the other end connected to the capacitor C2.

Hereafter, the operation of the semiconductor apparatus including the internal voltage generation circuit according to an embodiment of the present invention will be described with reference to FIGS. 2 to 4.

First, when the active enable signal act_en is disabled to a logic low level, the active driver 100 may not be driven because the active enable signal act_en is disabled. The standby driver 200 may output the internal voltage Vint, regardless of the operation mode of the semiconductor apparatus. As the NAND gate ND1 receives the low-level active enable signal act_en and performs a NAND operation, the control unit 310 may output the control signal ctrl at a logic high level. When the control signal ctrl is outputted at a logic high level, the NMOS transistor NM1 may be turned on. Thus, the capacitor C2 may be connected to the output node node_out. Then, the capacitor C2 may receive electric charges using the internal voltage Vint outputted from the standby driver 200.

Since the internal circuit 20 is not operated when the active enable signal act_en is disabled, the internal voltage Vint outputted from the standby driver 200 may cover the current consumption of the internal circuit 20. Thus, the capacitor C2 may perform the voltage stabilization operation by receiving electric charges rather than supplying electric charges.

When the active enable signal act_en is enabled to a logic high level, the internal circuit 20 may start a predetermined operation. When the internal circuit 20 enters the active mode, the power consumption of the internal circuit 20 may suddenly increase. Then, the active driver 100 may be driven to output the internal voltage Vint in response to the active enable signal act_en. At this time, the active driver 100 may require a certain amount of time until the active driver 100 outputs the internal voltage Vint required by the internal circuit 20. The standby driver 200 may have a relatively small drivability. In this case, when the internal circuit 20 does not receive an internal voltage Vint enough to operate, the internal circuit 20 may not perform a normal operation.

Thus, when the active enable signal act_en is enabled, the capacitor C2 may be continuously connected to the output node node_out so as to supply electric charges stored therein. That is, the capacitor C2 may supply the internal voltage Vint required by the internal circuit 20.

However, the capacitor C2 may be connected to the output node node_out only during a predetermined time after the active enable signal act_en is enabled to a logic high level. When the predetermined time passes, the capacitor C2 may be disconnected from the output node node_out. The predetermined time may correspond to a time required for the active driver 100 to completely output the internal voltage Vint required by the internal circuit 20. Thus, when the predetermined time passes, the internal circuit 20 may receive the sufficient internal voltage Vint from the active driver 100. Therefore, when the capacitor C2 is continuously connected to the output node node_out, the capacitor C2 may receive electric charges rather than supply electric charges. Then, as the capacitor C2 is disconnected from the output node node_out after the predetermined time passes, the internal voltage Vint outputted from the active driver 100 may not be supplied to the capacitor C2, but directly supplied to the internal circuit 20. That is, the operation time of the capacitor C2 may be limited to improve the performance of the internal circuit 20.

The operation will be described in more detail. When the active enable signal act_en is enabled to a logic high level, the control unit 310 may output the control signal ctrl at a logic high level during the predetermined time, that is, while the delay section 315 delays the enabled active enable signal act_en and outputs the delayed signal at a logic low level. Thus, the NMOS transistor NM1 may be continuously turned on, and the capacitor C2 may be continuously connected to the output node node_out so as to supply the required internal voltage Vint.

When the predetermined time passes after the active enable signal act_en is enabled, the delay section 315 may output a signal at a logic high level, and the control unit 310 may output the control signal ctrl at a logic low level. Thus, the NMOS transistor NM1 is turned off, and the capacitor C2 may be disconnected from the output node node_out.

Then, when the active enable signal act_en is disabled at a logic low level, the control unit 310 may output the control signal ctrl at a logic high level. Thus, the NMOS transistor NM1 may be turned on, and the capacitor C2 may be connected to the output node node_out so as to store electric charges using the internal voltage Vint outputted from the standby driver 200.

Figure 5:
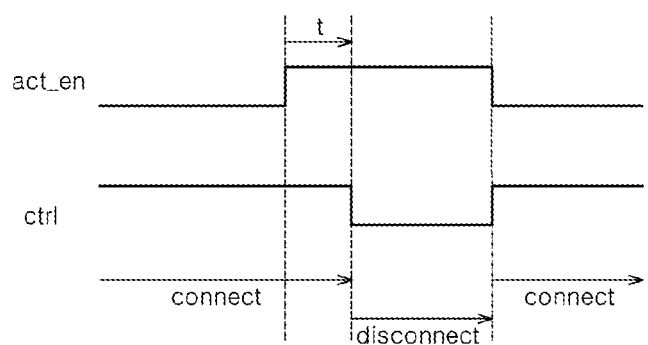
FIG. 5 is a timing diagram in which the control unit receives an active enable signal and outputs a control signal.

FIG. 5 is a timing diagram in which the control unit 310 receives the active enable signal act_en and outputs the control signal ctrl.

When the active enable signal act_en is enabled to a logic high level, the delay section 315 may receive the active enable signal act_en and delay the received signal during a predetermined time t. The control signal ctrl may be outputted at a logic high level during the predetermined time. The capacitor C2 may be continuously connected to the output node node_out and perform the voltage stabilization operation to supply electric charges as the current consumption of the internal circuit 20 increases.

When the predetermined time t passes after the active enable signal act_en is enabled to a logic high level, the NAND gate ND1 may receive the active enable signal act_en and the output of the delay section 315 at a logic high level, and output the control signal ctrl at a logic low level. The capacitor C2 may be disconnected from the output node node_out and stop the voltage stabilization operation.

When the active enable signal act_en is disabled to a logic low level, the control signal ctrl may be outputted at a logic high level. The capacitor C2 may be connected to the output node node_out again and start the voltage stabilization operation to receive electric charges.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. An internal voltage generation circuit of a semiconductor apparatus, comprising:
   an active driver configured to output an internal voltage to an output node;
   a standby driver configured to output the internal voltage to the output node; and
   a voltage stabilizer connected to the output node,
   wherein the voltage stabilizer starts a voltage stabilization operation of supplying or receiving electric charges to or from the output node when an active enable signal is disabled, and stops the voltage stabilization operation in a predetermined time after the active enable signal is enabled.

2. The internal voltage generation circuit according to claim 1, wherein the voltage stabilizer comprises:
   a control unit configured to output a control signal for controlling a start and a stop of the voltage stabilization operation in response to the active enable signal; and
   a stabilization unit configured to perform the voltage stabilization operation in response to the control signal.

3. The internal voltage generation circuit according to claim 2, wherein the stabilization unit comprises:
   a charge/discharge section configured to supply or receive electric charges; and
   a switching section configured to connect or disconnect the charge/discharge unit and the output node in response to the control signal.

4. The internal voltage generation circuit according to claim 3, wherein the control unit comprises:
   a delay section configured to receive the active enable signal and delay the received signal; and
   a NAND gate configured to receive an output of the delay section and the active enable signal and output the control signal.

5. An internal voltage generation circuit of a semiconductor apparatus, comprising:
   an active driver configured to output an internal voltage to an output node in response to an active enable signal;
   a standby driver configured to output the internal voltage to the output node; and
   a charge/discharge unit disconnected from the output node in a predetermined time after the active enable signal is enabled, and connected to the output node when the active enable signal is disabled.

6. The internal voltage generation circuit according to claim 5, further comprising a switching unit configured to connect or disconnect the charge/discharge unit and the output node.

7. The internal voltage generation circuit according to claim 6, further comprising a control unit configured to receive the active enable signal and output a control signal to control the operation of the switching unit.

8. The internal voltage generation circuit according to claim 7, wherein the control unit comprises:
   a delay section configured to receive the active enable signal and delay the received signal; and
   a NAND gate configured to receive an output of the delay section and the active enable signal and output the control signal.

9. An internal voltage generation circuit comprising:
   an active driver configured to generate and supply an internal voltage to an output node during an active operation;
   a standby driver configured to generate and supply the internal voltage to the output node regardless of an operation mode; and
   a voltage stabilizer connected to the output node and configured to perform a voltage stabilization operation and maintain a voltage level of the internal voltage.

10. The internal voltage generation circuit according to claim 9, wherein the voltage stabilizer is configured to output a control signal to control a start and a stop of the voltage stabilization operation in response to an active enable signal.

11. The internal voltage generation circuit according to claim 10, wherein the voltage stabilizer further comprises:
   a first inverter configured to receive the active enable signal;
   a second inverter configured to receive an output of the first inverter; and
   a NAND gate configured to receive the active enable signal and output the control signal as an operation result.

12. The internal voltage generation circuit according to claim 10, wherein the voltage stabilizer further comprises:
   a switching section configured to receive the control signal and have one end connected to the output node.

13. The internal voltage generation circuit according to claim 10, wherein the voltage stabilizer is configured to perform the voltage stabilization operation by receiving charges when the active enable signal is disabled.

14. The internal voltage generation circuit according to claim 10, wherein the voltage stabilizer comprises:
   a charge/discharge unit configured to be connected to the output node for a predetermined period of time when the active enable signal is enabled.

15. The internal voltage generation circuit according to claim 14, wherein the predetermined period of time corresponds to a time required for the active driver to output the internal voltage.

16. The internal voltage generation circuit according to claim 14, wherein the internal voltage is not supplied to the charge/discharge unit when the charge/discharge unit is disconnected from the output node.

17. The internal voltage generation circuit according to claim 14, wherein the voltage stabilizer comprises:
   a control unit configured to output the control signal during the predetermined period of time,
   wherein the control unit comprises a delay section configured to delay and output the active enable signal when the active enable signal has been enabled.

18. The internal voltage generation circuit according to claim 17, wherein the charge/discharge unit is disconnected from the output node when the predetermined period of time has passed.

19. The internal voltage generation circuit according to claim 17, wherein the charge/discharge unit is connected to the output node to store electric charges when the active enable signal is disabled.

20. The internal voltage generation circuit according to claim 14, wherein the voltage stabilizer is configured to stop the voltage stabilization operation when the predetermined period of time has passed.

* * * * *